United States Patent [19]
Kuni et al.

[11] 4,447,731
[45] May 8, 1984

[54] EXTERIOR VIEW EXAMINATION APPARATUS

[75] Inventors: Asahiro Kuni, Tokyo; Yukio Kembo, Yokohama; Nobuyuki Akiyama, Yokohama; Nobuhiko Aoki, Yokohama, all of Japan

[73] Assignee: Hitachi, Ltd., Tokyo, Japan

[21] Appl. No.: 327,191

[22] Filed: Dec. 3, 1981

[30] Foreign Application Priority Data

Dec. 5, 1980 [JP] Japan .................. 55-170999

[51] Int. Cl.³ .................................... H01J 37/20
[52] U.S. Cl. .............................. 250/442.1; 250/310
[58] Field of Search ............. 250/442.1, 310, 491.1, 250/492.1, 311

[56] References Cited

U.S. PATENT DOCUMENTS

| | | | |
|---|---|---|---|
| 4,179,604 | 12/1979 | Christou | 250/310 |
| 4,266,128 | 5/1981 | Suzuki | 250/442.1 |
| 4,349,242 | 9/1982 | Ogura | 250/310 |

FOREIGN PATENT DOCUMENTS

2062610 7/1971 Fed. Rep. of Germany ...... 250/310

Primary Examiner—Alfred E. Smith
Assistant Examiner—T. N. Grigsby
Attorney, Agent, or Firm—Antonelli, Terry & Wands

[57] ABSTRACT

An exterior view examination apparatus comprising a movable sample stage provided in a sample chamber of a scanning type electron microscope; a sample mounted on the stage; and an optical microscope which can observe the sample from an exterior of the chamber, mounted on the chamber in parallel with the scanning type electron microscope, the position of a surface part of the sample (mounted on the sample stage) to be observed, measured or analyzed being preliminary defined by the optical microscope, and the sample stage being moved by a certain amount thereby to bring the sample at the center of the visual field of the electron microscope.

7 Claims, 7 Drawing Figures

EXTERIOR VIEW EXAMINATION APPARATUS

BACKGROUND OF THE INVENTION

This invention relates to a method for determining the observation position of a sample when a minute shape of the sample surface is observed, the size is measured or the structure and the organization of the sample are analyzed (all these operations are referred to as the examination of an exterior view), by using a scanning type electron microscope (hereinafter abbreviated to SEM).

However, examination of the exterior view of a sample by using SEM has required a relatively long time, as will be understood below. Namely, the sample is first mounted on a sample stage. Then, a low magnification image of the sample is diplayed on a picture tube through operation of SEM. Next, the sample is moved while observing the low magnification image, to find out a portion to be examined. The position is determined by increasing the magnification factor as well as carrying out other operations as required. Thus, a final magnification with which a minute shape can be observed is reached.

The above-mentioned operations can be classified roughly into two parts: the SEM operation and the sample stage operation. The former consists of adjustment of a SEM image, or adjustment of tint, contrast, brightness and distortion, while the latter consists of finding out an observation position and defining the position at the center of the scan domain of the electron beam. Tint, contrast and brightness, etc. are once adjusted, they need not be adjusted again unless no remarkable variation occurs in the height, physical property and size of the sample. Therefore, the main time-consuming work lies in discovering the observation position and defining the position.

The reason for a large time consumption is as follows. Since it is not possible to discern, with the naked eye, even an approximate position of the sample in a sample chamber, the position is determined usually by observing an SEM image. But, the image is difficult to observe. Whereas SEM can demonstrate the physical relation between the irradiated electron beam and the substance which composes the sample on the screen of the picture tube, the overall contrast is low while the noise arising from statistical fluctuations of the number of trapped electrons is large. The dynamic range of SEM observation is much smaller than that of observation with a conventional optical microscope. Furthermore, the information quantity is small due to the laster scan. No color information is obtainable. It should be noted especially that those parts which could be observed with a high contrast by an optical microscope tend to have only a poor contrast in SEM. These facts are causes for a large time consumption in discovering an observation position.

In addition, these are not only a time loss but also cause a secondary drawback described below. Namely, when an electron beam is irradiated on a sample, contamination (deposition of carbon on the sample surface) and damage (variation in the physical property of the sample) may happen depending on the irradiation energy and the irradiation quantity of the electron beam and the vacuum environment, etc.

There would be no problem, if the sample is used only for observation. But, if the sample is used for further purposes, the influence of the above-mentioned effects can not be neglected. In the prior art method, since the electron beam is irradiated on various parts of the sample surface while the observation position is being sought, the sample is contaminated and damaged.

SUMMARY OF THE INVENTION

The object of this invention is to remove the above-mentioned defects of the prior art and to provide a method for rapidly determining the position of a part which should be subjected to the SEM exterior view examination and diminishing contamination and damage of the sample.

The exterior view examination apparatus of this invention comprises a movable sample stage provided in a sample chamber of a scanning type electron microscope; a sample mounted on the stage; an optical microscope which can observe the sample from an exterior of the chamber, mounted on the chamber in parallel with the scanning type electron microscope, the position of a surface part of the sample (mounted on the sample stage) to be observed, measured or analyzed being preliminary defined, by the optical microscope, and the sample stage being moved by a certain amount to thereby bring the sample at the center of the visual field of the electron microscope.

DETAILED DESCRIPTION OF THE PREFERRED EMBODIMENT

Figure 1:
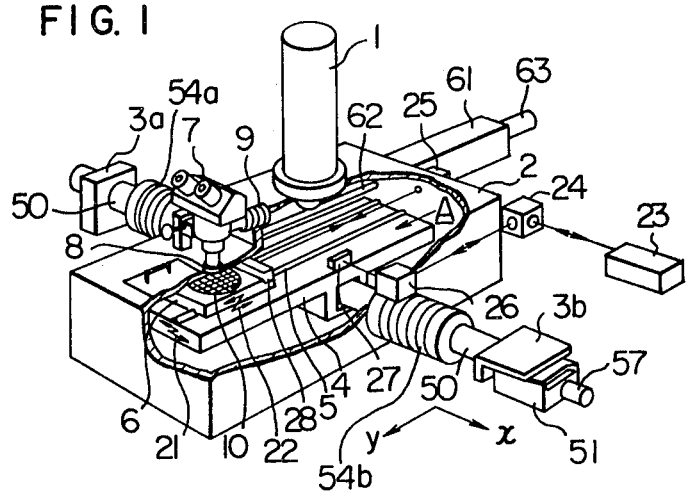
FIG. 1 is a perspective view of an apparatus in one embodiment of this invention.

Examination method of this invention will be described hereinafter in more detail with reference to the Drawings. FIG. 1 illustrates one example of SEM apparatus for observing or measuring the exterior view of the circuit pattern of a semiconductor wafer. A SEM mirror cylinder 1 is fixed on the top surface of a vacuum sample chamber 2. A sample stage generally designated by the reference character A, which can more in X and Y directions for the position determination, is provided in the vacuum sample chamber 2. A driving source (not shown) is provided for the sample stage A, with the driving being effected either manually by using a micrometer head, etc. or automatically with use of a pulse motor or a d.c. servomotor placed inside or outside the vacuum sample chamber 2. Movement of the sample stage A may be done by a well known method by utilizing a roller or a slide. In FIG. 1, for the purpose of better understanding, a stage 4 is movable in X direction 21 on guides 3a, 3b placed outside the sample chamber 2 and also movable in Y direction 22 on a rail 5 placed on the stage 4. The method for reading the stage position and for determining the position may be any known methods. For example, in the case of manual method, the scale on the micrometer head may be used. In the case of automatic method, signals from a pulse motor or a linear encoder may be used. A laser interferometer 23 for length measurement may be also employed as shown in FIG. 1. Numerals 24, 25, 26, 27 and 28 designate mirrors. A semiconductor wafer 10 is disposed on the stage 6, with the wafer being movable in both X and Y directions.

For example, as shown in FIGS. 4 to 7, the stage 4 is fixed to a shaft 50 extending outside of both sides of the sample chamber 2. One end of the shaft 50 is slidably supported by a slide bearing 3a to move in the x-direction, and, at the other end, the shaft is fixed to a table 52 which is adapted to slidably move on a base 51 in the x-direction by means of bearings 53. Bellows type boots 54a, 54b seal the inside of the sample chamber 2 from the atmosphere. A nut 55 is attached to the bottom of the table 52 to engage a ball screw 56 rotatably supported on the base 51. The ball screw 56 is linked to a motor 57. The guide 36 consisting of components 51, 52, 53, 55, 56 and 57 constitute an x-axis shifting mechanism.

The size of the x-stage 4 is so large so as to allow the y-stage 6 to move a corresponding distance on the x-stage, since there is a reasonable distance between the respective portions just below the SEM mirror cylinder 1 and the microscope 7. With a view to the size of the x-stage 4, it must be supported by oiled bearings as shown by the guide 3a which consists of preferably an oiled bearing, and the guide 3b. According to the present invention, the x-stage 4 is supported outside the sample chamber 2 so as to prevent the oil from entering the sample chamber 2 and any contaminants from depositing on the sample 10, with the results that figure and size of the sample 10 can be measured by the SEM with a high reliability.

Figure 4:
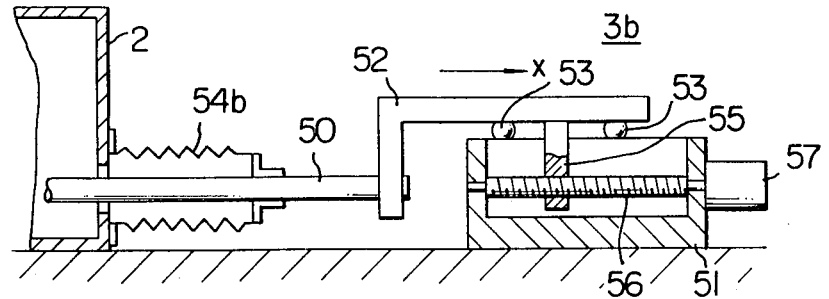
FIG. 4 is a front view showing an x-axis shifting mechanism.
Figure 5:
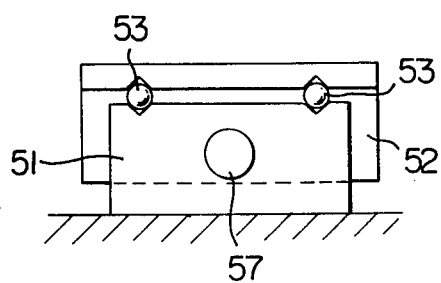
FIG. 5 is a side view of FIG. 4.
Figure 7:
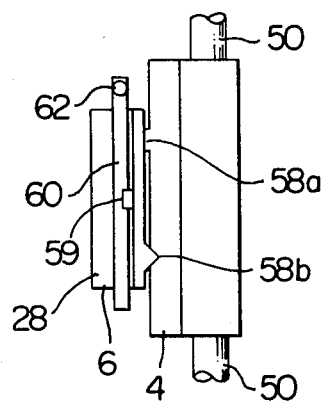
FIG. 7 is a side view of FIG. 6.
Figure 6:
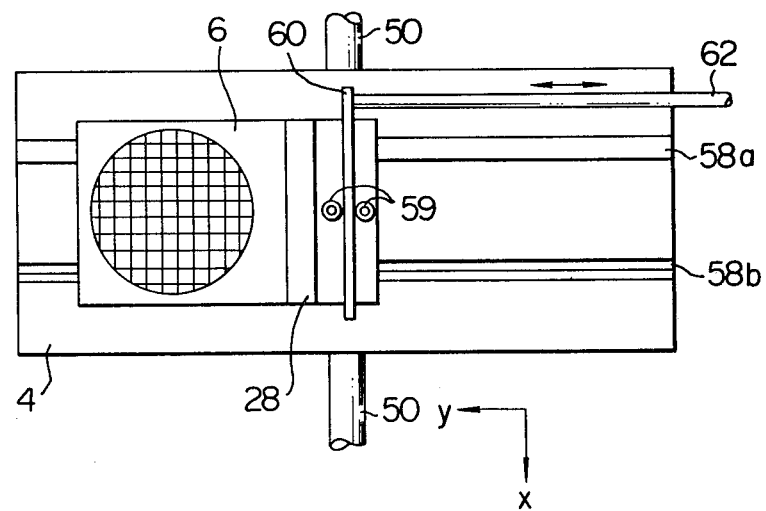
FIG. 6 is a plan view showing an x-stage and y-stage.

The y-stage is small and light so as to allow only the sample 10 to be disposed thereon. Therefore, a simple y-axis shifting mechanism can be employed as shown in FIGS. 6 and 7, in which there is provided a pair of guide rails 58a and 58b on the x-stage 4. The guide rails 58a and 58b are provided with, for example, Teflon (tradename) coatings. Rollers 59 are disposed on respective sides of a slider 60 which is fixed to an axial rod 62. The axial rod 62 is able to slidably move through a sealing cover 61 in the y-direction by a motor 63 (FIG. 1). A similar linking mechanism as shown in FIG. 4 may be employed to move the axial rod 62 in the y-direction.

An optical microscope 7 is mounted on the sample chamber 2 in parallel with the SEM mirror cylinder 1 so that the sample 10 on the stage 6 may be subjected to a microscopic examination through a transparent window 8 such as a glass plate. The thickness of the window 8 may be made thin, say about 2 mm, if the size of the window is made as small as an order of a bundle light incident on the objective lens. In FIG. 1, a vertical illumination method using a built-in illumination source 9 is shown. But, this illumination method is not a sole one, but a perspective method with use of a separate illumination source may also be effective. However, if a scintillator and a photomultiplier are used for the detection of secondary electrons, etc., it would be necessary to place a screen plate, not shown, between the part illuminated by the light source and the scintillator in order to avoid penetration of both illumination and external lights into the scintillator.

Marks such as cross hairs are placed in the visual field of the microscope 7. The positional relation between the center of cross hairs and the center of the SEM scanning in preliminarily defined in the X-Y plane. Since both the microscope 7 and the SEM mirror cylinder 1 are fixed to the sample chamber 2, the positional relation between them is constant. After a part of the sample surface to be observed is adjusted at the center of cross hairs by moving the stage, the stage is further shifted by a constant amount in accordance with the positional relation. Then, the sample to be observed is positioned at the center of the SEM scanning.

Figure 2:
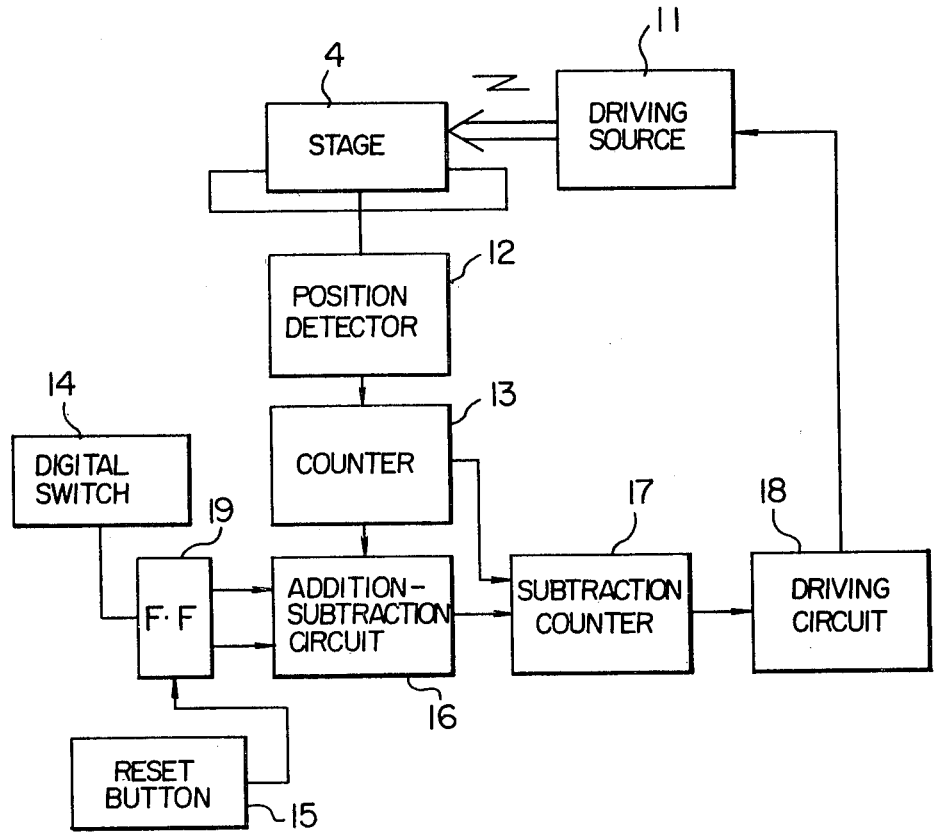
FIG. 2 is a block diagram of a control circuit according to the method of this invention.

Process of positioning is as follows. In the case of manual operation, the stage 4 should be shifted by a value obtained by adding a constant value to a scale value with which the position is adjusted by the microscope. In the case of automatic method, a process as shown in FIG. 2 should be followed. FIG. 2 shows a process for the movement along one axis. Two similar circuit systems are needed for the movement in X and Y axes. A position signal from a position detector 12 for the stage 4 (when the stage position is controlled only by pulses of a pulse motor, the signal consists of these pulses) is counted up or down by a counter 13 depending on the direction of the movement of stage 4. A constant amount of shift between the microscope 7 and the SEM mirror cylinder 1 is registered in a digital switch 14. After the position is adjusted by the microscope 7, a reset button 15 is pushed. Then, the content of the counter 13 showing the present position of the stage 4 is added to the value of the digital switch 14 in an addition-subtraction circuit 16 and set in a subtraction counter 17. The stage 4 is moved by a driving source 11 through a driving circuit 18 until the set value subtraction by the content of the counter 13 reaches zero. A flip-flop 19 is provided in order to return the stage 4 to the position of the microscope 7 after the observation by SEM. The value of the digital switch 14 is either added or subtracted in the addition-subtraction circuit 16. Every time when the reset button 15 is pushed, the value is alternately set by the flip-flop 19.

The accuracy of positioning of the stage depends on the final magnification factor of observation of SEM. For example, for a magnification of $10^4$, the scanning domain of SEM becomes about 10 $\mu m^\square$. Hence, a reasonable accuracy of positioning may be $\pm 5$ $\mu m$. It is favorable that the magnification factor of the objective lens of the microscope 7 is large. On the other hand, however, it is required that, if observed through the window 8, the operation length is large. Therefore, the magnification factor of the objective lens should be from 2 to 5. If a larger magnification is needed, the objective lens may be placed under the window 8, that is, inside the vacuum sample chamber 2. This would lead to a good result, avoiding aberration of image. But, it would be necessary to form a hole in the trunk so that the objective lens may be accommodated in vacuum. Furthermore, the tint adjustment of the microscope needs a complicated structure. Even if the magnification factor of the objective lens is of the order of 2 to 5, with an ocular lens having a magnification factor of 20, a positional shift of the order of 5 $\mu m$ can be discriminated without difficulty.

If a mechanism of moving the stage in Z direction (vertical direction) is available, the microscope and SEM could be arranged preliminarily to have a common focus. Then, tint is adjusted only by moving the stage in Z direction under the visual field of the microscope. Tint adjustment for a SEM image is no longer necessary. If such a mechanism is not available, tint adjustment for SEM should be done in advance on a corner part of the sample before the SEM observation. While the part of the sample to be observed or analyzed, is being searched by the microscope until its position is determined at the center of the scanning domain of SEM, beam blanking would be effective to avoid any irradiation of the electron beam onto the sample chamber.

Figure 3:
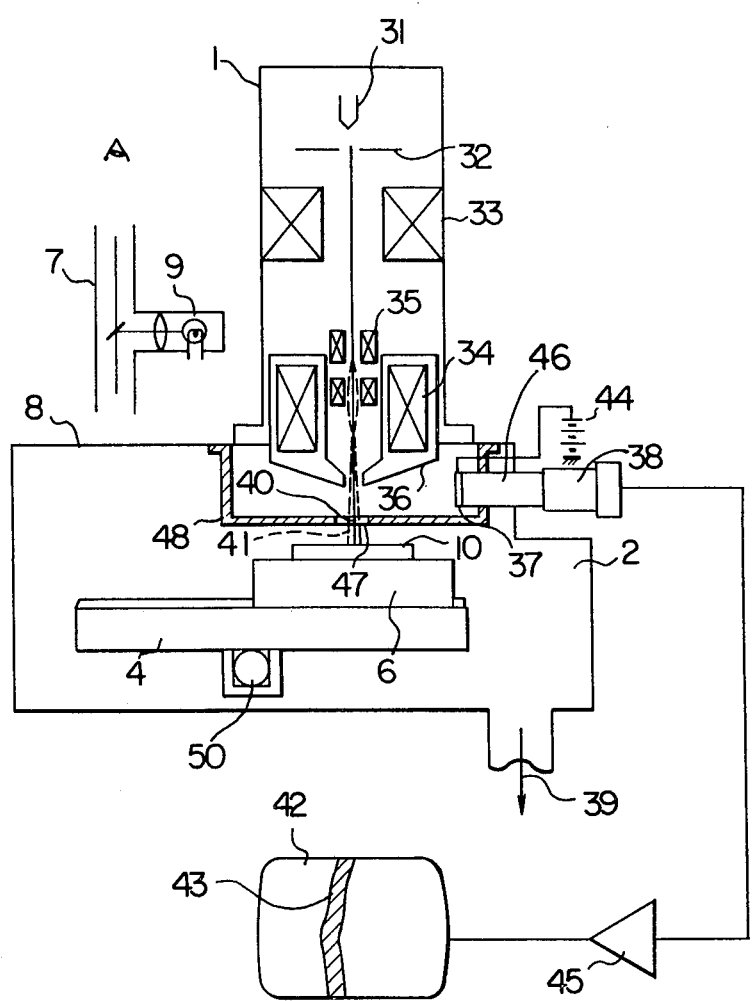
FIG. 3 is a schematic view of the SEM.

Concrete explanation of the SEM 1 will be made hereinafter in conjunction with FIG. 3. This is an application of a scanning type electron microscope. Electrons emitted from a filament 31 are accelerated by an acceleration electrode 32 and, after passing through a focusing lens 33 and an objective lens 34, irradiated in the form of a spot 40 on a sample 10 which is placed in a sample chamber 2. The sample chamber 2 is evacuated to vacuum, as shown by a numeral 39. The spot is deflected by a deflecting system 35 and scanned on the sample 10 to be measured. The number of electrons emitted from the sample 10 differs depending on the shape and the composing substance thereof. These electrons are collected by a scintillator 37 and converted into an electric signal by, for example, a photomultiplier 38. The signal is amplified by an amplifier 45, whereby an elarged view 43 of one end of the boundary of the sample 10 is obtained on a monitor 40 as an image signal. The wave length of the electron beam employed is $10^{-3}$ to $10^{-4}$ $\mu$m and the spot diameter is less than 0.01 $\mu$m. Therefore, if a linearity correction to scanning is done, an absolute accuracy of the order of 0.01 $\mu$m can be obtained without difficulty.

Combination of the scintillator 37 and the photomultiplier 38 as described above is most effective in obtaining the image signal from the electrons emitted by the sample 10. Detection mechanism is as follows. Namely, in order that electrons emitted from the sample 10 under measurement are collected by the scintillator 37 to cause light emission, a high electric potential is applied to the surface of the scintillator 37 from a high voltage source 44. Thus, an electric field appears in the vacuum sample chamber 2. Emitted electrons are accelerated and focused by the potential gradient and made to impinge on the scintillator 37 to cause light emission. The light is passed through a light guide 46 and detected by the photomultiplier 38. A cup type screen plate 48 with a hole 47 is fixed to the bottom of SEM 1 on the upper cover of the sample chamber 2. The scintillator 37 and the light guide 46 are inserted into a space partitioned by the screen plate 48. The diameter of the hole 47 is of the order which does not disturb the scanning of the electron beam. The gap between the lowest end of the screen plate 48 and the sample 10 to be measured should be made as small as possible, a reasonable value being a few mm. There is no special limitation on the material for the screen plate 48 if it is an electric conductor. Although in FIG. 3 the screen plate 48 is of cup type, it may be of planar type which divides the sample chamber into upper and lower parts. This prevents any variation in focusing electric field due to a movement of the sample stage 4, also ensures an effective trapping of electrons emitted from the sample 10. As a result, any variation of irradiation position of the electron beam is suppressed and, hence, the measuring accuracy is remarkably improved. In order to avoid any contamination by the electron beam of the sample 10 under examination and any distortion of the image due to electric charging, the image signal as well as the size and the one dimensional shape of the sample 10 should be acquired during single electron beam scanning.

In particular, when size and one-dimensional figure of the sample 10 are measured, it is advantageous to provide a memory for storing a model waveform, in order to compare the model waveforms with a waveforms of image signals obtained by the photomultiplier 38 when the sample 10 is scanned by the SEM. According to this method, specific points on the image signals can be detected to facilitate the intended measurements.

As described above, according to the method of this invention, positioning of the part to be observed by SEM can be done easily. Specifically, in the case of a semiconductor mask and a wafer pattern which are flat and have only a small pattern step so that the contrast is poor, and in the case with an array of similar patterns having no characteristic mark around a minute observation point, the time for positioning is reduced by a factor above 5. Therefore, the invention enjoys such merits that the irradiation time required by the electron beam for an observation point is short and that it is not necessary to irradiate the electron beam except on the observation point.

We claim:

1. An exterior view examination apparatus comprising:
   a movable sample stage provided in a sample chamber of a scanning type electron microscope;
   a sample mounted on said sample stage; and
   an optical microscope for observing said sample from an exterior of said sample chamber, said optical microscope being mounted on said chamber parallel with said scanning type electron microscope, the postion of a surface part of said sample to be observed, measured, or analyzed being preliminarily defined by said optical microscope, said sample stage being moved by a certain amount to thereby bring said sample at a center of the visual field of said electron microscope and wherein said movable sample state comprises a first movable stage supported outside of said sample chamber to slidably move in a first direction by a first driving means provided outside of said sample chamber, and a second movable stage disposed on said first movable stage to slidably move between said optical microscope and said electron microscope in a second direction perpendicular to said first direction by a second driving means provided outside of said sample chamber.

2. An exterior view examination apparatus according to claim 1, comprising an electron beam detecting means for detecting an electron beam which scans the surface of said sample in said scanning type electron microscope including a scintillator, a light guide and a photomultiplier.

3. An exterior view examination apparatus according to claim 1, comprising a screening means provided in said scanning type electron microscope whereby an electric field generated by said electron beam detecting means does not vary with a movement of said sample or said sample stage.

4. An exterior view examination apparatus comprising:
   a sample chamber;
   a scanning type electron microscope provided on an upper side of said sample chamber, said scanning type electron microscope comprising electron beam detecting means for detecting an electron beam which scans an upper surface of a sample in said scanning type electron microscope including a scintillator means, a light guide means, and a photomultiplier means;

an optical microscope juxtaposed with said scanning type electron microscope on an upper side of said sample chamber for observing a reflected image of the upper side of the sample from an upper-exterior of said sample chamber;

movable sample stages provided in said sample chamber, said movable sample stages comprising a first movable stage supported outside of said sample chamber to slidably move in a first direction by a first driving means provided outside of said sample chamber, and a second movable stage disposed on said first movable stage to slidably movable between said optical microscope and said electron microscope in a second direction perpendicular to said first direction by a second driving means provided outside of said sample chamber;

whereby said second sample stage is moved by a certain amount determined by a distance between said optical microscope and said scanning type electron microscope to thereby bring said sample at a center of the visual field of said electron microscope and can be observed, measured, or analyzed by a signal obtained from said electron beam detecting means of said electron microscope.

5. An exterior view examination apparatus according to claim 4, further comprising a screen means provided in said scanning type electron microscope whereby an electric field generated by said electron beam detecting means does not vary with the movement of said sample of said sample stage.

6. An exterior view examination apparatus according to claim 5, further comprising a laser interferometer for measuring a moving displacement of said first and second movable stages, whereby said certain amount is determined by measuring a moving displacement of said first and second movable stages by said laser interferometer.

7. An exterior examination apparatus comprising:
a sample chamber;

a scanning type electron microscope provided on an upper side of said sample chamber, said scanning type electron microscope comprising an electron beam detecting means for detecting an electron beam which scans an upper surface of the sample in said scanning type electron microscope including a scintillator means, a light guide means, and a photomultiplier means;

an optical microscope juxtaposed with said scanning type electron microscope on the upper side of said sample chamber for observing a reflected image of an upper surface of the sample from an upper exterior of said sample chamber;

a movable sample stage provided in said sample chamber, said movable sample stage further comprising a first movable stage supported outside of said sample chamber to slidably move in a first direction by a first driving means provided outside of said sample chamber, and a second movable stage disposed on said first movable stage to slidably move between said optical microscope and said electron microscope in a second direction perpendicular to said first direction by a second driving means provided outside of said sample chamber; and screening means having an opening thereby provided between said movable sample stage and said scanning type electron microscope for preventing variation of an electric focusing field of said scanning type electron microscope caused by moving said movable sample stage;

whereby said second sample stage is moved by a predetermined amount determined by a distance between said optical microscope and said scanning type electron microscope to thereby bring said sample at a center of the visual field of said electron microscope and can be observed, measured, or analyzed by a signal obtained from said electron beam detecting means of said electron microscope.

* * * * *